United States Patent [19]

Nguyenngoc

[11] Patent Number: 4,991,062
[45] Date of Patent: Feb. 5, 1991

[54] EMI REDUCING CIRCUIT CARD APPARATUS

[75] Inventor: Kinhquoc Nguyenngoc, Montclair, N.J.

[73] Assignee: AT&T Bell Laboratories, Murray Hill, N.J.

[21] Appl. No.: 352,795

[22] Filed: May 16, 1989

[51] Int. Cl.$^5$ .............................................. H05K 9/00
[52] U.S. Cl. ................................. 361/424; 174/35 GC; 211/41; 361/415
[58] Field of Search ............... 361/212, 220, 391, 395, 361/399, 415, 424; 439/59–62, 64, 65, 108, 101, 341, 607, 609; 174/35 R, 35 MS, 35 GC, 51; 211/41; 49/483, 490; 24/295, 265 A

[56] References Cited

U.S. PATENT DOCUMENTS

| | | | |
|---|---|---|---|
| 4,384,165 | 5/1983 | Loving, Jr. | 174/35 GC |
| 4,631,641 | 12/1986 | Brombal | 361/424 |
| 4,713,633 | 12/1987 | Saito | 361/424 |
| 4,758,928 | 7/1988 | Wierec | 361/415 |
| 4,762,966 | 8/1988 | Kosanda | 174/35 GC |
| 4,780,570 | 10/1988 | Chuck | 124/35 GC |
| 4,821,145 | 4/1989 | Corfits | 361/415 |
| 4,872,212 | 10/1989 | Roos | 361/415 |

Primary Examiner—Gerald P. Tolin
Attorney, Agent, or Firm—Ruloff F. Kip

[57] ABSTRACT

A circuit card comprises a printed wiring board, a plastic faceplate therefor, and a resilient electroconductive sheet metal strip extending the length of such plate and fastened to its rear side. The strip at its opposite ends provides spring contacts electrically coupled by the strip's middle part. The card is adapted to be inserted in a holding bay with a rectangular front opening of greater width than height and bordered at its top and bottom by designation strips for the cards to be put in such bay. Metallic structural means adjacent the opening provides an a.c. circuit path extending around the opening in a closed loop. When the card is inserted in the bay, the spring contacts engage with metal-surfaced regions on the designation strips to provide an electrical shunt across such loop and, thereby, to reduce electromagnetic interference radiating through such opening from the bay's interior.

8 Claims, 6 Drawing Sheets

EMI REDUCING CIRCUIT CARD APPARATUS

TECHNICAL FIELD OF THE INVENTION

This invention relates generally to apparatus which constitutes a circuit card or which utilizes circuit cards. More particularly, this invention relates to apparatus of such kind adapted to reduce electromagnetic interference ("EMI") and to related methods.

BACKGROUND OF THE INVENTION

Many electrical systems and equipment are characterized in use by the radiation therefrom of extraneous electromagnetic wave energy generated as an incident to the operation thereof. Such systems and equipment run the gamut from, say, power lines (60 cycle hum) to, say, microwave ovens (microwave energy leakage), and the frequencies of such radiated extraneous waves are distributed over a correspondingly broad spectrum. The presence in the environment of radiated energy of such sort is generally undesirable because it is a form of "noise," and because it may adversely affect the operation of other electrical or electronic systems and equipment in the vicinity of the source of its emanation. Accordingly, that kind of emitted electromagnetic wave energy is referred to as electromagnetic interference or, as abbreviated, "EMI."

With the advent of telecommunications and computing equipment which employ digital techniques and clock pulses having a high repetition frequency, the problem of EMI emission therefrom has become troublesome to the extent that the Federal Communications Commission has promulgated regulations providing that the EMI radiation from such equipment must not exceed certain prescribed maximum permissible levels. A further characteristic of such equipment is that it employs as plug-in components a large number of circuit cards and (as described in the article entitled "Modeling Electromagnetic Interference Properties of Printed Circuit Boards," by Clayton R. Paul, published on pages 33-50 of the Jan. 1989 issue of the "IBM Journal of Research and Development," the boards of those cards are rich sources of EMI. Consequently, there is a need for means to reduce the EMI emitted by this equipment and originated from the cards therein to the point where such interference is less by a safe margin than the maximum permissible level specified therefor by the FCC and, preferably, is far enough below that level to assure that it will not be exceeded in any foreseeable circumstance of practical use of the equipment.

In equipment of the kind considered which employs circuit cards as components thereof, the cards are commonly retained in the equipment in bays which are spaces between shelves included in the equipment. Each such bay is bounded at its top and bottom by upper and lower ones of such shelves, at its rear by a backplane, and at horizontally opposite ends of such rear, by vertical sidewalls extending from the rear to the front of the bay. Each such bay is, moreover, open at its front and has a front opening in the shape of a rectangle of greater horizontal then vertical dimension. The one or more bays of such equipment each normally contain a bank of circuit cards inserted into the bay from its front and retained in the bay such that the cards in the bank are vertical and in side-to-side stacked relation. When such cards are included in telecommunications equipment wherein each card serves a communications channel or channels respective thereto, such a bank is called a "channel bank." Here, however, such a bank will be referred to more generically as a card bank or circuit card bank.

When the described circuit card apparatus is operating, electromagnetic wave energy originally generated by circuit cards in a bay escapes as radiation from that bay into the exterior environment through the bay's rectangular front opening which is bordered around it periphery by a closed-loop, a.c. electrical circuit path. In those circumstances, the front opening acts as a slot antenna for such radiation. It is an empirical rule for such a slot antenna that it is a good radiator only of electromagnetic waves shorter in wavelength than the larger of the two dimensions of the rectangular opening, the slot antenna tending to suppress radiation of larger wavelength. It follows from such a rule that, if EMI escaping from the circuit cards into the bay is distributed fairly evenly over the frequency spectrum, a decrease in the size of such larger dimension will produce a decrease in the EMI "wattage" radiated out through such front opening to the exterior.

As another empirical rule, however, it is only a reducing of the larger of the two dimensions of the front opening which will be primarily effective in reducing the EMI power radiated through the opening. To put it another way, if the larger dimension is kept constant and the smaller dimension is reduced in size, the radiated EMI power will not be relatively reduced by anywhere near the amount as the reduction in radiated EMI power effected by reducing the larger opening dimension. Consequently, an aperture at the front of the bay which is narrow but of the full length of the bay (as, say, an interstitial gap between the housing surrounding the front of the bay and the edge of a cover closure for the bay) will, despite its small width, permit an undesirably large amount of EMI to escape from the bay to the exterior.

U.S. Pat. No. 4,762,966, issued Aug. 9, 1988, in the name of David E. Kosanda, to Rockwell International Corporation, proposes to reduce EMI escaping from a space within a box for containing circuit cards by providing a cover for the front of such space so that it is closed at top and bottom except for narrow interstitial gaps left between the top and bottom edges of the cover and adjacent portions of the box, and by providing for such gaps what is referred to in the patent as an "EMI gasket." That gasket comprises for each such gap a plurality of resilient metallic fingers on the cover and disposed on its edge on the outer side of such gap to be spaced from each other in the gap's length and to project forwardly from the cover towards the portion of the box which is on the gap's inner side. When the cover is attached to the box (in some way not disclosed by Kosanda), the forward ends of the fingers are described by the patent as being forced back towards the edge of the cover or panel, during which time electrical contact is maintained between the cover and the box, and the spacing between the various fingers for the top and bottom gaps "is such that signal frequencies of lower than a given frequency cannot pass through the opening."

The EMI reducing scheme proposed by Kosanda (to the extent it is understood from the disclosure of that patent) has, however, the disadvantages, among others, that the cover contemplated thereby is an additional item of expense for the circuit card containing apparatus, hides from view the faceplates of the circuit cards inserted in the box (and thus precludes any casual visual inspection of those faceplates and any associated indicating devices), must be opened or removed each time a card is to be added to or removed from the bank thereof in the box, and takes up space at the front of the box.

SUMMARY OF THE INVENTION

The above-described disadvantages of the Kosanda arrangement are obviated according to one aspect of the invention hereof by providing EMI reducing circuit card apparatus in the form of a circuit card comprising a printed wiring board, circuitry on such board, and an electroconductive shunting means at the front of such board and comprising a pair of spaced contact means and circuit means electrically coupling such two contact means together. Those two contact means are adapted, upon insertion of the card into a bay with a front opening encircled by a closed-loop a.c. circuit path, to make respective engagements with two contact regions adjacent the card respectively coupled electrically to two parts of such path spaced from each other around the closed-loop thereof so that such engagements result in completion through such shunting means of a shunt electrical path extending between such parts and converting such original closed-loop path into a plurality of closed-loop paths. In terms of the EMI radiated out through the mentioned front opening, the effect of providing such shunt path is to divide the original slot antenna at such opening into two slot antennae which are reduced in size relative to the original slot antenna in at least one of its dimensions and which accordingly effect a reduction in the wattage of the radiated EMI. If such reduction in size is in the larger of the two dimensions of the original antenna, the EMI reduction is substantial, but even if such reduction in size is in the smaller of such two dimensions, some reduction in EMI wattage is realized. Moreover, the EMI reduction can be further increased by utilizing a plurality of the circuit cards just described to provide for the original closed-loop path around the bay's front opening a plurality of shunt paths extending across the original loop to, in effect, divide the original slot antenna into more than two slot antennae.

While the invention will be described in terms of an exemplary embodiment in the form of subscriber loop carrier equipment used in telecommunications, it will be appreciated that the invention is applicable to any electronic equipment in which circuit cards are components thereof, and to circuit cards adapted to be used in any such equipment.

BRIEF DESCRIPTION OF THE DRAWING

For a better understanding of the invention, reference is made to the following description of representative embodiments thereof and to the accompanying drawings wherein.

DETAILED DESCRIPTION OF EXEMPLARY EMBODIMENTS OF THE INVENTION

Figure 1:
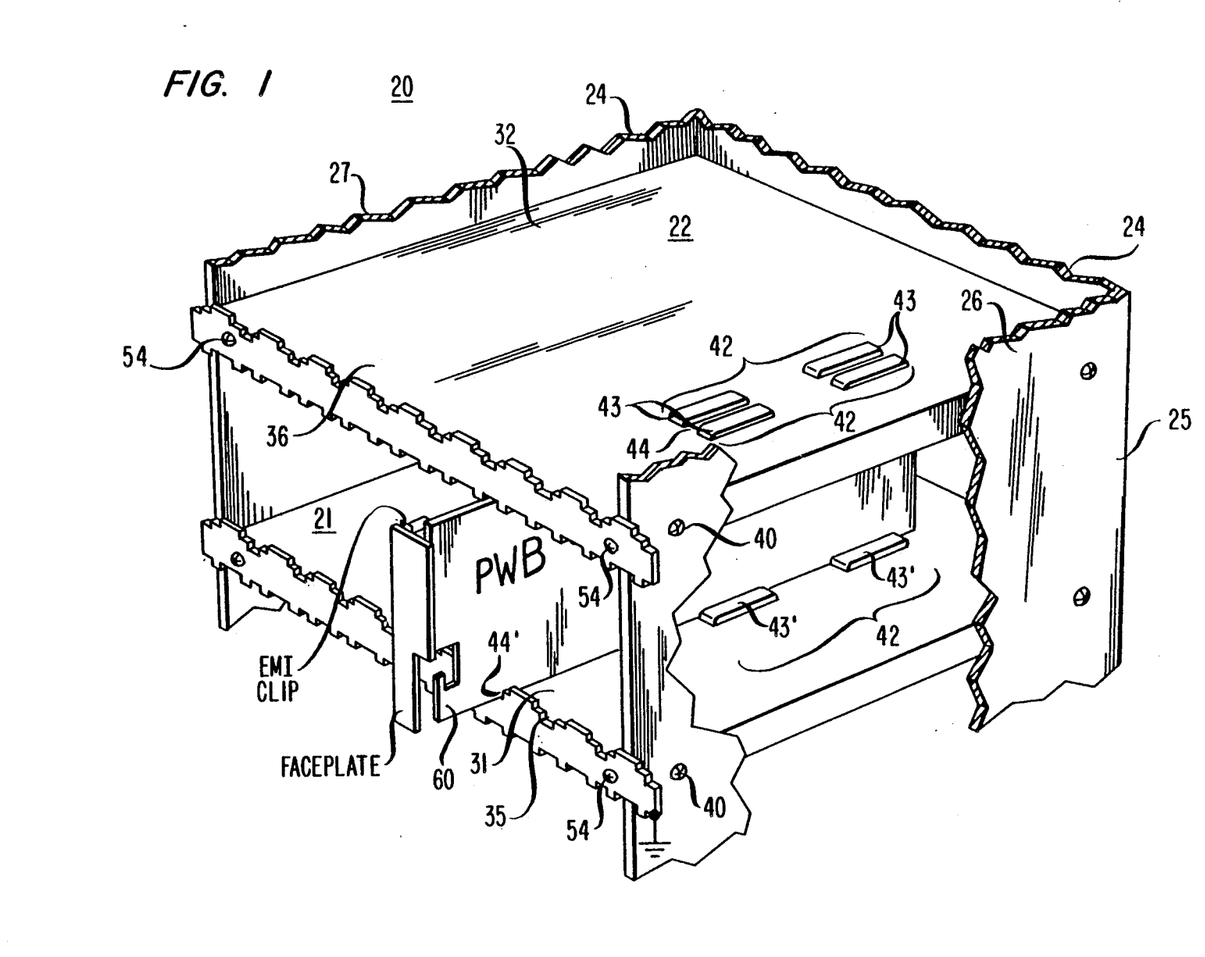
FIG. 1 is a schematic isometric view of a part of subscriber loop carrier equipment, and of an EMI reducing circuit card included in such equipment.
Figure 2:
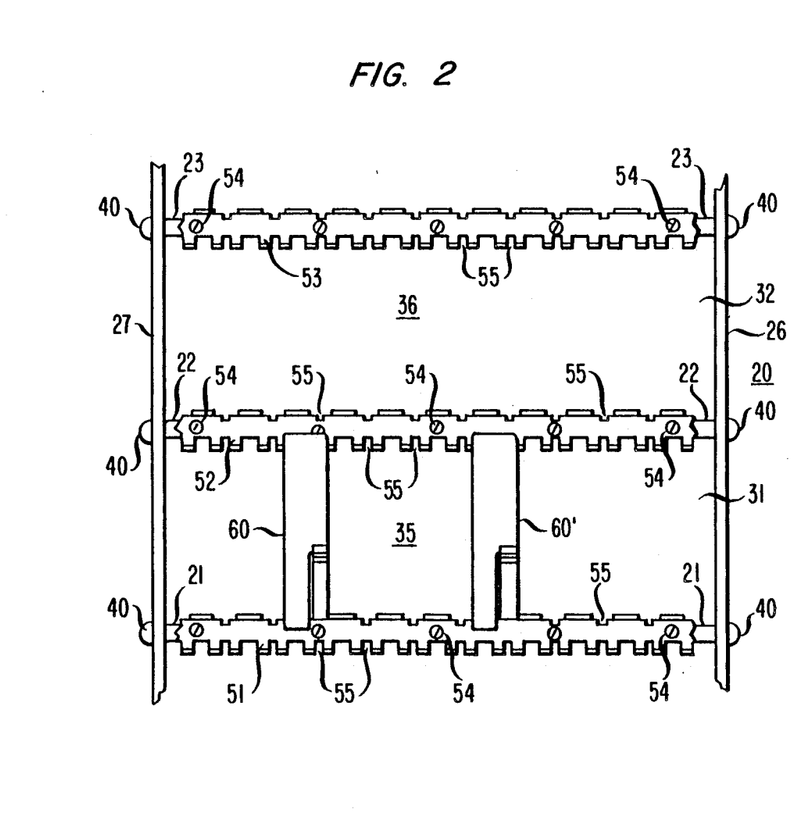
FIG. 2 is a schematic front elevation of the FIG. 1 equipment showing two bays thereof and a plurality of circuit cards in one of such bays.

Referring now to FIGS. 1 and 2, the reference numeral 20 designates circuit card apparatus in the form of subscriber loop carrier equipment 20 comprising vertically spaced metallic shelves 21, 22, 23 within a housing 24 provided by a rear backplane 25 and sheet metal side walls 26, 27 extending on either side of such shelves from the backplane to the front of the equipment. Housing 24 is grounded. The horizontal shelves 21-23 and the vertical elements 26, 27 provide two bays 31 and 32 of which the lower bay 31 is defined between shelves 21 and 22 while upper bay 32 is defined between shelves 22 and 23. Subscriber loop carrier equipment such as unit 20 commonly consists of five of such bays. For economy of drawing, however, only two of them are shown.

Bay 31 is a space bounded at its bottom and top by the top and bottom surfaces of, respectively, shelves 21 and 22, at its rear by a portion of backplane 25, and at its sides by portions of the sidewalls 26, 27. Bay 32 is similarly bounded by shelves 22 and 23 and by other portions of such backplane and sidewalls.

The bays 31 and 32 are open at the front of equipment 20 and have respective rectangular front openings 35 and 36, each having a horizontal dimension greater than its vertical dimension. The function of the bays 31 and 32 is to provide receptacles for banks of circuit cards. One such card 60 is shown in FIG. 1 as partially inserted into bay 31. FIG. 2 depicts bay 31 as holding card 60 and an additional card 60', while bay 32 is shown as being empty.

The shelves 21, 22 and 23, between which bays 31 and 32 are defined, are rectangular members which, for convenience, are shown as being solid, but which are ordinarily in the nature of perforated gratings. These shelves are attached to the housing 24 of equipment 20 by tap screws 40 passing at the rear and front of sidewalls 26 and 27 through those walls into the vertical sides of such shelves. Since screws 40 are tap screws, they provide adjacent the front openings of bays 31 and 32 a gap-free electrical interconnection from the metal of the sidewalls, through the metal of the screws, to the metal of the shelves.

The shelves 21, 22 and 23 are formed to have paired columns 42 of ridges 43 vertically projecting from the top and bottom surfaces of each shelf and spaced in each such column in the front to rear direction of the shelf. The two columns of ridges in each pair are transversely spaced from each other to define between them a guideway 44, extending in the shelf's front to rear direction, for guiding and holding in place the top or bottom edge of a particular circuit card inserted into the associated bay. An exemplary pair of columns 42 of such ridges 43 with a guideway 44 therebetween is shown in FIG. 1 on the upper surface of shelf 22. The right hand one of a similar pair of columns 42' of ridges 43' is shown in the same figure on the upper surface of shelf 21, with the card 60 being partly inserted into the guideway 44' defined between those two columns.

Mounted by the shelves 21, 22, 23 are three corresponding sheet metal designation strips 51, 52, 53 (FIG. 2) attached to the front sides of their respective shelves by tap screws 54 passing through the strips and into the metal of the shelves. In FIG. 2, the ends of strips 51, 52, 53 have been broken away to show the underlying shelves. Since screws 54 are tap screws, they provide, as before, an uninterrupted electrical connection from the metal of the strips through the metal of the screws to the metal of the shelves.

Figure 3:
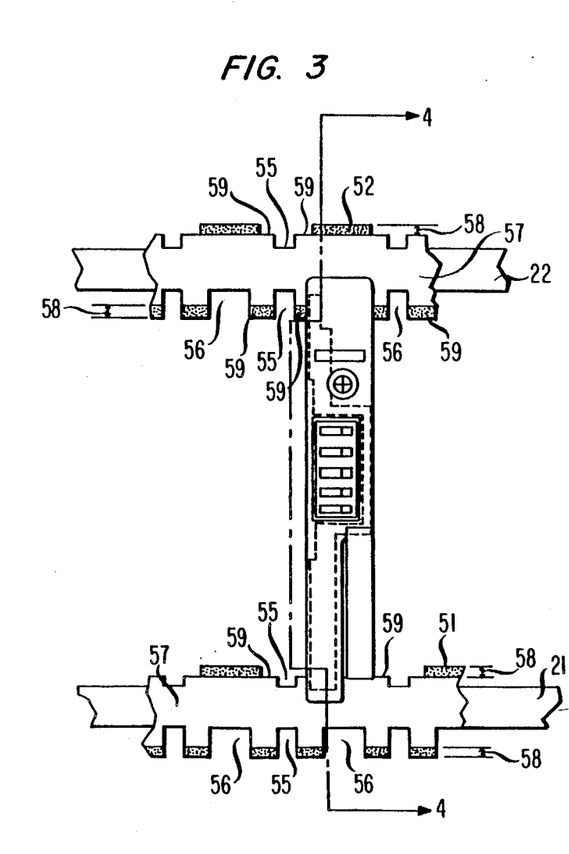
FIG. 3 is a front elevation of the circuit card of FIG. 1 and of portions adjacent such card of the FIG. 1 equipment.

Each of the designation strips has formed in both its top and bottom edges a sequence of notches (FIGS. 2 and 3) spaced from each other in the transverse length of the strip. Certain of these notches are aligned with the card guideways 44 defined on the top and bottom surfaces of the shelves. Those notches serve accordingly as card entry notches 55, permitting a particular card 60 to be inserted through that notch into a guideway 44 in one of the bays. There is a card entry notch for both the top margin and the bottom margin of each card.

The card entry notches 55 may alternate in the length of a strip with other notches 56 which are keyway notches adapted to cooperate with "keys" provided on the circuit cards 60 for equipment 20 to prevent any particular circuit card from being fully inserted into a bay of the equipment at any location other than the one at which the card should be received.

The outer surfaces of the designation strips 51, 52, 53 are for the most part covered with a coating 57 of enamel or other insulating material. At the top and bottom of each such strip, however, there are narrow marginal bands 58 of the strips' outer surface which are free of enamel and are primarily metallic and overlie metallic contact regions 59 adjacent each card entry notch 55. If strips 51, 52, 53 are made of a non-oxidizing material such as stainless steel, contact regions 59 can have bare metal surfaces. Alternatively, the surface areas exposed within bands 58 need not be bare metal but, rather, can be covered with a thin film of material which inhibits oxidation of the underlying metal (which may be, say, aluminum) and which may be, for example, the material IRIDITE ® available from the Witco Corporation, 520 Madison Avenue, New York, N.Y. Such thin film provides so little impedance to the passage of high-frequency electrical current therethrough that, practically speaking, the bands 58 and contact regions 59 can be considered to have metallic surface areas.

Figure 4:
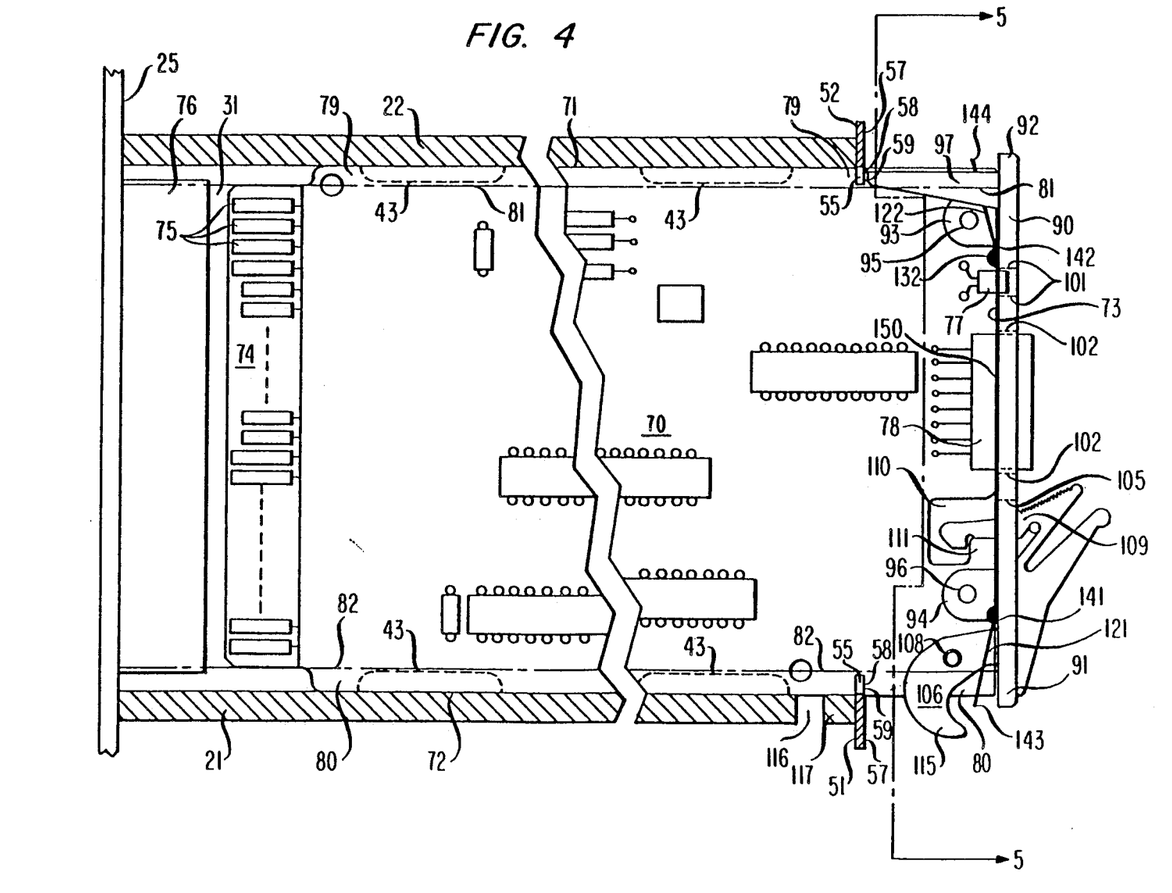
FIG. 4 is a left side elevation of the FIG. 3 circuit card and of portions of the FIG. 1 equipment adjacent such card, some of such portions being viewed in cross section as indicated by the arrows 4—4 in FIG. 3, and the card being partially inserted into the holding bay therefor in the equipment.

The circuit card 60 is shown in FIG. 4 (as in FIG. 1) partly inserted into the bay 31 defined between shelves 21 and 22. Card 60 comprises a generally rectangular board 70 of insulative material having laterally spaced top and bottom margins 71 and 72 extending longitudinally from an edge face 73 at the front of the board to the board's rear area 74. The surface seen in FIG. 4 of that rear area has thereon an array of metallic contact pads 75 adapted when card 60 is fully inserted into bay 31 to be received in an edge connector 76 to make electrical contacts therein with corresponding contacts (not shown) in the connector 76.

The board 70 is a printed wiring board ("PWB") having thereon (on its side seen in FIG. 4) circuitry comprising the mentioned pads 75, printed wiring (not shown), and various discrete electrical components, including an indicating, light-emitting diode 77 and a test jack 78. The components 77 and 78 are mounted on board 70 to partly project beyond the front edge face 73 of the board. While the circuitry of the board is distributed over most of its area on its side seen in FIG. 4, the board at its top and bottom is characterized on its surface on both of its sides by narrow longitudinal border strips 79, 80, whose inner boundaries are marked by dot-dash lines 81, 82. Within those border strips 79, 80, the board is free of any projecting circuitry on its surface. The purpose of having such border strips is to permit the board to fit within the entry notches 55 and guideways 44 provided therefor so that the board can be fully inserted into bay 31.

At the front of board 70 is a laterally (i.e., vertically) elongated, generally rectangular, insulative faceplate 90 which is relatively narrow in its transverse (i.e., horizontal) dimension, and which is disposed relative to board 70 such that the centerplanes of the two vertical elements 70 and 90 are at right angles to each other. As shown, the faceplate 90 laterally extends between bottom and top end portions 91 and 92 thereof which are laterally outwards of the top and bottom margins 71 and 72 of the board 70.

Faceplate 90 is composed of synthetic resinous material and is molded from such material so as to have various parts which are integral with the plate, and of which some will now be described.

On its back side, the plate 90 has a pair of plastic bosses 93, 94 projecting rearwardly from the main body of the plate. Metal screws 95, 96 pass from the far side (not seen in FIG. 4) of board 70 through holes therein and then into the bosses 93, 94 to fasten plate 90 to and in fixed relation with board 70.

Disposed above and in transversely displaced relation with boss 93 is a columnar plastic key 97 projecting rearwardly from the main part of plate 90. Key 97 is adapted to fit into the particular keyway 56 which is associated in designation strip 52 with the entry notch 55 at the particular location in the transverse length of bay 31 at which the particular card 60 which is shown is to be inserted into that bay. Key 97 is so shaped and sized and positioned on faceplate 90 that the key will not fit into any other of the keyways 56 formed on strip 51. The key 97 thus prevents inadvertent full insertion of card 60 into bay 31 at a place where the card does not belong.

The plate 90 has formed therein by its molding a small aperture 101 and a large aperture 102 extending through the plate from rear to front and in which are respectively received the LED 77 and the test jack 78. LED 77 does not pass all the way through the plate but can be viewed from outside the plate at its front to determine if the LED is "on" or "off." Test jack 78 passes all the way through plate 90 to project beyond it.

Plate 90 has formed in its lower right hand outside corner (FIG. 3) a laterally elongated indentation 105 providing for passage through the plate of parts of a plastic latch handle 106 pivotally mounted (by a hollow rivet 108) on board 70 at its lower front corner (FIG. 4). Latch handle 106 is shown in FIG. 4 as rotated fully counterclockwise to its latching position at which an integral part thereof constituting a resiliently deflectable pawl arm 109 is inserted into a recess 110 formed in the front end of board 70 to engage in that recess with a part of that board constituting a tooth 111 projecting up between that recess and the front edge 73 of the board and holding the latch handle in latching position so long as the tooth is engaged by the pawl.

Assume that, initially, card 60 is partly retracted from bay 31 as shown in FIG. 4, and assume further, and solely for purposes of explanation, that elements 109 and 111 are engaged as above described to hold latch handle 106 in latching position. There is of course no need for such elements 109 and 111 to be so engaged when card 60 is so retracted from bay 31. When, however, such is the case, a finger 115 at the bottom of the latch handle 106 extends vertically down to be horizontally opposite the designation strip 51 and thus block further entry of card 60 into bay 31.

In order to fully insert card 60 into bay 31, the back of pawl 109 is pressed down to disengage its front from tooth 111. Latch handle 106 is then rotated clockwise to raise the finger 115 at the bottom of the latch above the top of designation strip 51, and the card is then pushed into the bay to cause the forward part of the finger to pass by the strip. Latch handle 106 is then rotated counterclockwise to produce reengagement of pawl 109 and tooth 111. In the course of such counterclockwise rotation of the handle, the forward part of finger 115 passes through an aperture 116 in shelf 21, and the finger's inner side then hooks around a bar section 117 provided by the shelf so that the reengagement of elements 109 and 111 causes the card 60 to be locked in bay 31 in fixed position relative to the shelves 21, 22 and the designation strips 51, 52. The card may thereafter be removed from the bay by disengaging pawl 109 from tooth 111 and rotating latch 106 counterclockwise as before described, and then pulling the card out.

Considering now the EMI reducing features of the described equipment, the card 60 has thereon an electroconductive shunting means disposed at the front of board 70 and the rear of faceplate 90 and comprising a pair of spaced, resiliently deflectable contact means and circuit means bridging such pair of means and electrically coupling them together. That shunting means may be conveniently provided by an elongated sheet metal strip 120 (FIG. 6), say, 5-10 mils thick, constructed of a metallic material which is resilient and a good conductor of electricity, and which material may be, for example, but without limitation, stainless steel, phosphor bronze or beryllium copper. Strip 120 has bottom and top end portions 121 and 122 which serve as electrical spring contacts, and, adjacent the inner ends of these portions, the strip has holes 123, 124 therethrough. Those holes are laterally spaced apart by the same distance as separates a pair of laterally spaced plastic studs 125, 126 projecting outwardly and rearwardly (FIG. 7) from the main body of faceplate 90.

Figures 8, 9:
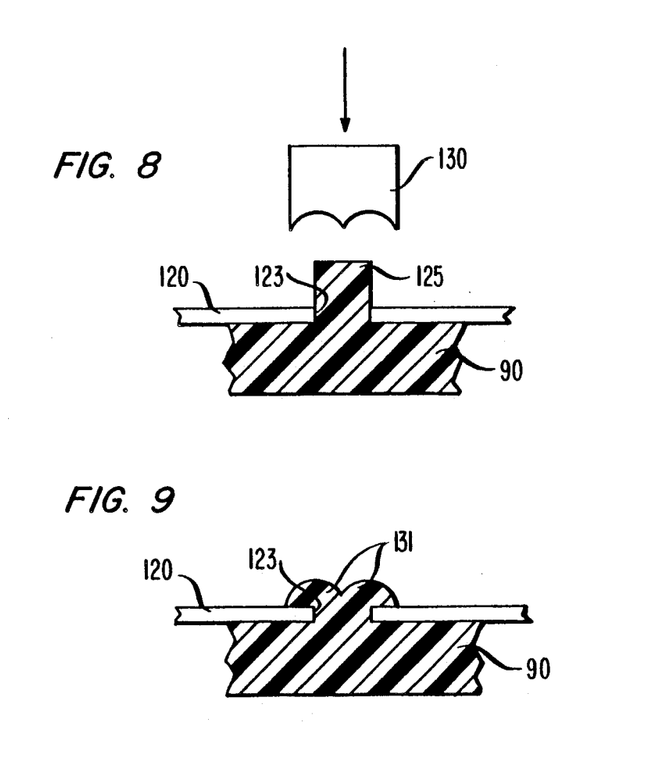
FIG. 8 is an enlarged schematic view in cross section of a mode for fastening the FIG. 6 clip to the FIG. 7 faceplate.
FIG. 9 is an enlarged schematic view in cross section of the results of the practice of the fastening method depicted in FIG. 8.

The strip 120 is fastened to the back side of plate by heat staking in a manner as follows. Studs 125, 126 are passed through the holes 123, 124 in strip 120, and the strip is advanced towards the back side of plate 90 until it lies flat against that side with the free ends of the studs projecting outwards of the outside of the strip. An ultrasonic horn 130 (FIG. 8) is then applied forcibly to the projecting free end of stud 125 to melt its plastic material by ultrasonic energy, and to convert that free end into an expanded locking head 131 (FIG. 8) which rivets the region of strip 120 around hole 123 to the back of the plastic plate 90. Similar application (not shown) of horn 130 to the free end of stud 126 converts that free end into an expanded head 132 similarly riveting the region of strip 120 around hole 124 to the faceplate.

The electrical contacts provided by strip 120 are in the form of resilient metal blades having respective anchored inner ends 141, 142 adjacent the locking heads 131, 132, and respective free ends 143, 144 disposed laterally outwards of the inner boundaries 81, 82 of border strips 79, 80 on PWB 70. As shown, they may also lie laterally outwards of the outer margins 71, 72 of those strips. Those contacts 121, 122 are disposed so that when in their resiliently unstressed condition, they slant outwardly and rearwardly from their anchored ends 141, 142 to their free ends 143, 144, which latter ends are, accordingly, longitudinally displaced rearwardly from the back surface of the faceplate 90. The end portions 91 and 92 of the faceplate extend in the lateral dimension outwards of the free ends 143, 144 of the contacts 121, 122. That faceplate, therefore, provides a backing for those contacts over the full length of each.

Figure 5:
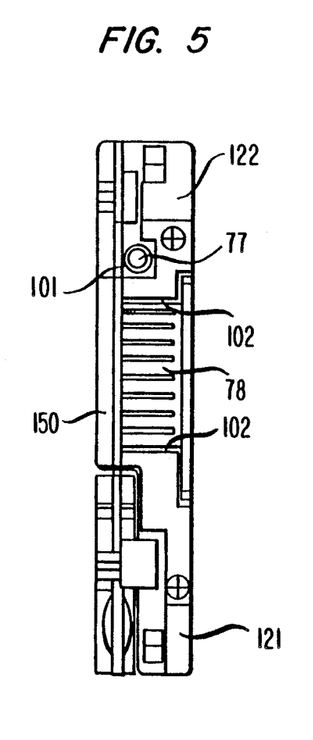
FIG. 5 is a rear elevation in cross section, taken as indicated by the arrows 5—5 in FIG. 4 of the FIG. 3 card.
Figure 6:
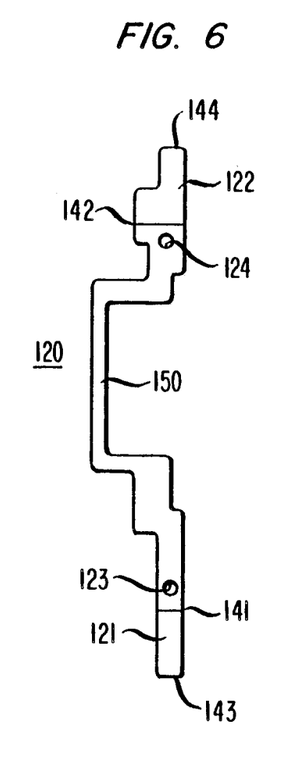
FIG. 6 is a rear elevation of the resilient clip component of the FIG. 3 card.
Figure 7:
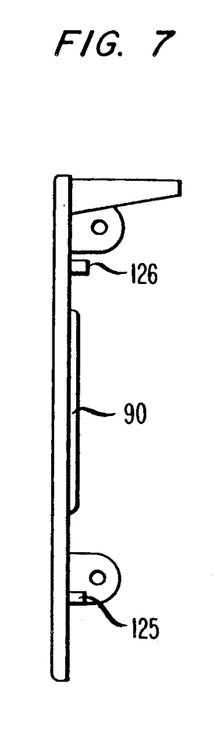
FIG. 7 is a right side elevation of the faceplate component of the FIG. 3 card.

The contacts 121 and 122 are electrically coupled together by circuit means in the form of a flat segment 150 of strip 120, such segment 150 extending from one to two other of the anchored ends 141, 142 of those contacts. As best shown in FIG. 6, segment 150 has an irregular shape and, as will be evident from a comparison of FIGS. 5 and 6, the reason why it has such shape is to permit the segment to stretch between the contacts 91 and 92 in proximate relation to the back side of faceplate 90 while concurrently providing for avoidance by the segment of key 97 and the bosses 93, 94 and of the rear openings of the faceplate apertures 101 and 102, and for avoidance thereby of blockage by the segment of passage into such apertures 101 and 102 of, respectively, the LED 77 and the test jack 78, both mounted on the PWB 70.

The circuit card 60' has circuitry on its PWB which differs in layout and composition from the circuitry on the board 70 of card 60. Otherwise, the card 60' is similar in structural makeup to card 60. Thus, the card 60' includes an electroconductive strip alike in size, shape and mounting thereof to strip 120 on card 60, and the card 60' also includes an indicating LED and a test jack alike to elements 77, 78 on card 60 and received like those elements in apertures in the insulative faceplate of card 60'.

USE AND OPERATION OF EMBODIMENT

Figure 10:
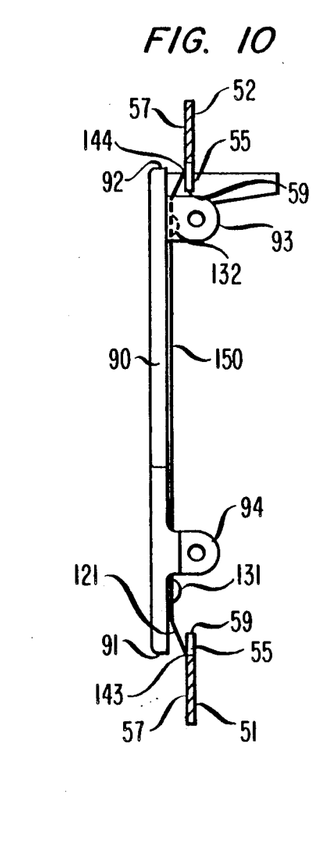
FIG. 10 is a right side elevation of the front end, broken away, of the FIG. 3 card and of regions, shown in cross section, belonging to the designation strips of the FIG. 1 equipment and making contacts with the resilient ends of the FIG. 6 clip of the FIG. 3 card.

Card 60 is used as follows to provide EMI reduction. In the course of insertion of the card into bay 31, the contacts 121, 122 of strip 120 are at first disengaged from any part of the extent of the metal housing 24 for that bay. As, however, such insertion proceeds by advancement of the card into the bay, the free ends 143, 144 of such contacts make respective initial contacts (FIG. 10) with the lower and upper designation strips 51 and 52 on that housing (FIG. 2) and, more particularly, with the metallic surfaced contact regions 59 provided on such strips (FIG. 3) adjacent to the entry notches 55 on such strips in which the top and bottom border strips 79, 80 of the PWB 70 are received. Because of such engagements between such contact regions 59 on the strip and the free ends of the contacts 121, 122 on the card, as the advancement of the card into the bay continues, such contacts are both resiliently deflected rearwardly so that the free ends 143, 144 of the contacts and the end portions 92, 92 of the faceplate 90 undergo relative movement towards each other to result in a progressive decrease in the spacing thereof. That deflection of the contacts 121, 122 (and the consequent stressing of these contacts) renders the engagements between them and the contact regions 59 on strips 51 and 52 a pressure engagement under yieldable force producing a firm and reliable electrical contact between the contacts on the card and such regions. Each such deflection of the contacts 121, 122 produces a minute wiping action which keeps the contacts clean.

When the insertion of the card 60 into the bay is completed (as earlier described) by manipulating latch handle 106 to hook its finger 115 around bar section 117 and to engage its pawl 109 with the tooth 111 on board 70 (FIG. 3), the resultant locking of the card in full forward position relative to the housing 24 serves to maintain these forcible engagements between the contacts 121, 122 on the card and the mentioned contact regions on the strips 51, 52 for so long as the card 60 remains so locked in position relative to equipment 20. When the card is in that latched position, the contacts 121, 122 therein have maximum deflection but still have some spacing from the end portions 91, 92 of the faceplate. Depending, however, on the interaction of latch handle 106 with the housing 117 and on other factors, the equipment 20 and card 60 can be designed so that the contacts 121, 122 will be deflected all the way back into flush contact with the faceplate's end portions 91, 92 which can in themselves be somewhat resiliently deflectable so as to be slightly bent rightwardly (FIG. 4) relative to the center of faceplate 90 as a result of locking of card 60 into place by manipulation of latch handle 106.

Figure 11:
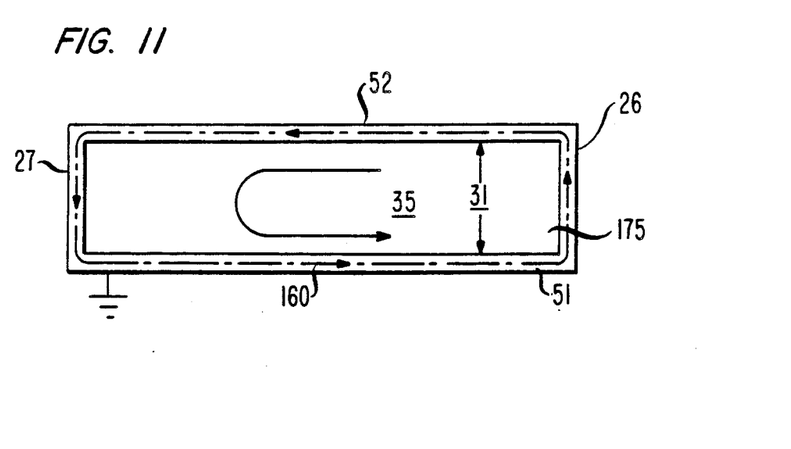
FIGS. 11-13 are schematic electrical diagrams showing the effect of the contacts depicted in FIG. 10 on a circuit path at the front of the FIG. 1 equipment.

When the mentioned contact regions 59 on designation strips 51 and 52 are forcibly engaged as described by the contacts 121, 122, the strip 120 on card 60 provides a shunt path for a.c. electrical energy between these contact regions. These two contact regions 59 are in turn electrically coupled to a path for a.c. electrical energy which surrounds the periphery of the front opening 35 for bay 31, and which is schematically represented in FIG. 11 by the dot-dash line 160. The path 160 defines a single closed loop represented by the arrow 161. The loop of path 160 can be traced as extending (FIGS. 1, 2 and 3) from the contact region 59 of strip 51 engaged by contact 121, through that strip and the screws 54 in shelf 21 to the shelf; rightward in shelf 21, through the screws 40, attaching wall 26 to shelf 21, to that wall; upward through wall 26, and through screws 40, attaching that wall to shelf 22, into such shelf; leftward in shelf 22 (with which the contact regions 59 on strip 52 are coupled through screws 54) to and through the screws 40 on the left hand end of shelf 22; downward in wall 27 to and through the screws 40 passing into the left hand end of shelf 21; and then, through the screws 54 in that shelf into strip 51 and back to the place of beginning. Note that the contact regions 59 on the designation strips, those strips themselves and the associated screws 54 can be considered either as being in the loop 161 of path 160 or as being electrically coupled to separate parts of such loop. Note also that the metallic means comprising the members and elements traversed by path 160 are grounded as indicated in FIG. 11.

The diagram of FIG. 11 is relevant to a situation in which the bay 31 of equipment 20 has therein a full bank of circuit cards, none of which, however, is equipped with an electroconductive shunting means the same as or equivalent to the strip 120 earlier described. The circuit cards in that bank in their operation emit into bay 31 electromagnetic wave energy over a spectrum of wavelengths in circumstances in which there is only one area of front opening 35 encircled by a loop of an a.c. circuit path, namely, the full area of that opening encircled by loop 161. All of opening 35 acts as a single slot antenna 175 for radiating EMI constituted of such electromagnetic wave energy generated in bay 31. As earlier described, it is an empirical rule for such a slot antenna that it is a good radiator only of electromagnetic waves shorter in wavelength than the larger of the two dimensions of the slot, such larger dimension in the case of front opening 30 being its horizontal dimension. In the situation depicted in FIG. 11 there is no EMI reduction according to the invention hereof.

Figure 12:
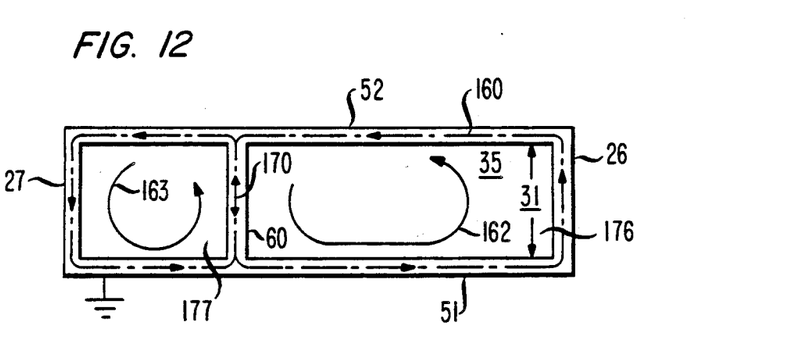

The FIG. 12 diagram represents circumstances which are changed as compared to those portrayed by FIG. 11 to the extent that one of the bank of circuit cards filling bay 31 and lacking electroconductive shunt strips 120 (or the like) has been replaced by the described circuit card 60 equipped with such a strip. As shown in FIG. 12, card 60 is inserted into the bay at a horizontal location about one-third of the way from the left hand end to the right hand end of opening 35. When card 60 is so inserted, the contacts 121, 122 on that card engage with two contact regions 59 on, respectively, the lower and upper designation strips 51, 52 to complete through the strip 120 on the card a shunt a.c. current path 170 between these two separate contact regions 59 and, thus, between two separate parts of the a.c. circuit path 160 extending around opening 35. The effect of that shunting of path 160 by path 170 is to divide the original single closed loop 161 into two loops 162 and 163 and, correspondingly, to divide the original slot antenna 175 into two slot antennae 176 and 177. In each of those two antennae, the larger of its two dimension is its horizontal dimension, but that dimension for each of slot antennae 176, 177 is smaller than the largest (or horizontal dimension) of slot antenna 175. From the empirical rule, therefore, that a slot antenna is a good radiator only of electromagnetic wave energy of wavelengths shorter than the antenna's larger dimension, it follows that the configuration shown in FIG. 12 will have the effect on the electromagnetic wave energy, generated in bay 31 over a spectrum of wavelengths, of substantially attenuating radiation through opening 35 of waves of relatively longer wavelength which would not be so attenuated by the FIG. 11 configuration. Hence, EMI reduction is realized in going from the FIG. 11 to the FIG. 12 configurations by the insertion, as described, in the bank of circuit cards in bay 31 of just one card 60 having on it a strip 120 providing a shunt path across the a.c. circuit path encircling the front opening of the bay.

In the FIG. 12 configuration, as between the slot antennae 177, 176 of smaller and larger horizontal dimension, respectively, the antenna 176 is controlling with respect to the amount of reduction in EMI power realized in relation to the FIG. 11 configuration. That is so because although slot antenna 177 tends to suppress radiation therefrom of EMI waves of wavelength longer than its horizontal dimension, those of such waves which are shorter in wavelength than the horizontal dimension of antenna 177 can and will still escape from bay 31 through the larger slot antenna 176.

From what has been said, it will be evident that if only one circuit card with an electroconductive shunting strip thereon is used for EMI reduction in a bank of cards in a bay, the optimum position for that card is the midway position in the largest dimension of the front opening of the bay. That is so since locating the card at that midway position leads to the greatest reduction in the EMI power radiated. It has been found that by the use of only one such card at approximately that midway position, it is possible to reduce the radiated EMI power substantially.

Figure 13:
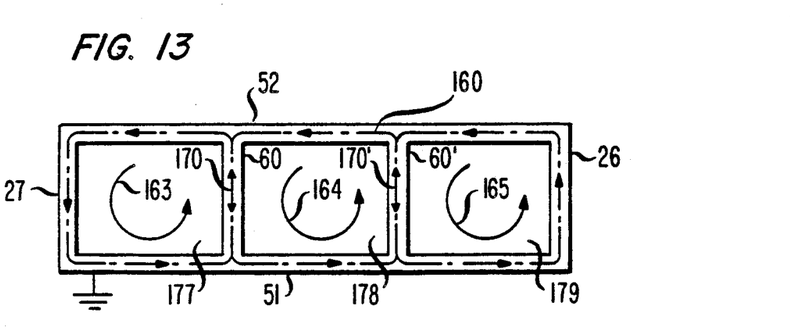

FIG. 13 is a diagram representing an extension of the above teachings in that card 60' with an electroconductive shunting strip thereon like strip 120 has been inserted into the bank of cards in bay 31 (in place of another card not having such a strip) so as to have the effects of dividing the loop 162 (FIG. 12) for a.c. energy into two such loops 164, 165 (FIG. 13) and of concomitantly converting the slot antenna 176 of FIG. 12 into two slot antennae 178, 179 (of FIG. 13). For the reasons discussed above, the FIG. 13 configuration yields greater EMI reduction than does the FIG. 12 configuration.

The increasing, as described, of the EMI reduction by increasing the number of slot antennae into which opening 35 is divided by the insertion into the bay 35 of an increased number of strip-carrying circuit cards is a technique which, it has been found, can be desirably carried out to its limit which occurs when every circuit card in the bank of cards in bay 31 has such a strip providing such a shunting path between parts of the path around the opening. The effect of course, of having every such card so equipped is to divide the area of opening 35 into many slot antennae. When that is done, the horizontal dimension of each slot antenna becomes less than its vertical dimension so that by the mentioned rule of thumb, the size of such vertical dimension would then be primarily controlling as to how much EMI reduction could be realized. Hence, there would seem to be no point in having so many slot antennae.

It has been found, however, that when, by the use of cards with shunting strips therein to divide the opening 35 into slot antennae of similar shape, these antennae are increased in number beyond that yielding a horizontal dimension for each such antenna equal to its vertical dimension, a further reduction in EMI is still achievable. Moreover, it is desirable in any case that every circuit card in the bank of cards inserted into bay 31 be equipped with an electroconductive shunting strip (like strip 120) because, if only one or a few cards in the bank each has such a strip, it becomes a problem to foretell whether or not the one or few cards will have the proper positioning within the bay to divide the front opening 35 into a configuration of slot antennae which maximizes the EMI reduction or comes acceptably close to so doing.

Accordingly, it is preferred that every circuit card inserted into bay 31 have thereon an electroconductive shunting means the same as or the equivalent of the strip 120 of card 160.

Consideration will now be given to some quantitative aspects of the effect on EMI reduction of the configurations represented by FIGS. 11-13. Typically, the distance between the upper lower shelves 21 bounding bay 31 (and also, the vertical dimension of opening 35 and the distance between the top and bottom margins of the boards of the circuit cards 1 is about 3.5 inches. The bay 31 is adapted to hold a bank of twenty four cards having spacings between centers of about three quarters of an inch when the cards are in their side-to-side relation within the bank. It follows that the horizontal dimension of opening 35 is about eighteen inches.

The EMI emissions which are of troublesomely high value occur for the most part in the frequency range of 40-90 MHz. For that range the EMI radiated under the circumstances represented by FIG. 11 comes within 1.5 Db of the maximum level of EMI permitted for such range by FCC regulations. That 1.5 Db "margin of safety" is, however, so small that there is a real risk that the margin will be wiped out altogether if changes are made to the design of the circuitry on the cards, or because of manufacturing variations or variations caused by differences in the sites at which the equipment is located.

In the circumstances represented by FIG. 12 in which the a.c. circuit path 160 around opening 35 is shunted by a strip on only one circuit card included in the card bank at a reasonably central location within the horizontal dimension of opening 35, the measured margin of safety is increased to about 5.5 Db for EMI in the 40-90 MHz range. A safety margin of such magnitude is a comfortable one for most applications. If the technique of adding more shunts to path 160 is carried out to the circumstances depicted by FIG. 13 and beyond to the limit at which all of the cards in the card bank have strips like strip 120 shunting path 160, then such margin of safety increases for the 40-90 MHz EMI range to about 9-10 Db, which is a good margin to work with indeed.

The above-described embodiments being exemplary only, it is to be understood that additions thereto, omissions therefrom, and modifications thereof can be made without departing from the spirit of the invention. Some examples without limitation of what has just been said are as follows.

The mentioned electroconductive shunting means comprising the pair of spaced contact means and the circuit means coupling them together need not be integral parts of a single member like strip 120. The mentioned circuit means can be provided by a variety of conductors such as, say, wire means, and, for high-frequency applications, might even be provided by capacitance instead of by a resistance element. If the faceplate is insulative, the mentioned electroconductive shunting means may be provided by an elongated deposit of metallic material disposed on the rear surface of the faceplate provided that, again, such pair of spaced, resiliently deflectable contact means are provided by having the end portion of the faceplate being suitably resiliently deflectable.

The electroconductive shunting means of the circuit card need not be carried by the faceplate but, rather, can be carried by the PWB of the card at the front of the PWB. The arrangement just mentioned is particularly useful where the card has no faceplate, as happens in some cases. The EMI reduction can be effected not only by a circuit card supported in guideways in the holding bay by the structure of the PWB of the card but also by a device so supported by a simple slide means in the form of an insertable contact support unit (as, say, without restriction, a plain board or other planar slide member) received in such guideways and provided with such an electroconductive shunting means. Where the equipment with which one or more of the described EMI reducing circuit cards or devices are used does not have any designation strips, the invention hereof can be put into practice by having the spaced contacts on the card or cards (or device or devices) engage with regions which are on the framing around the front opening of the bay holding the cards, and which regions have surfaces which are of bare metal or which workably approximate that condition. There are numerous other variants within the invention hereof of the embodiments above described.

Accordingly, the invention is not to be considered as limited save as is consonant with the recitals of the following claims.

I claim:

1. A circuit card adapted to reduce electromagnetic interference ("EMI") comprising: a rectangular insulative board having a laterally extending front edge face and a pair of laterally spaced margins therefor longitudinally extending between said face and the rear of said board, electronic circuitry distributed over said board, an insulative faceplate having front and back sides and fastened to said board, said board and said faceplate fastened thereto together forming a board-faceplate assembly, said faceplate being disposed transverse to said board and forward of and adjacent to said board's edge face so that said plate's back side has separate portions which are, respectively, registering and non-registering with such face, said plate extending laterally between said board margins and lying over said edge face, a pair of electrical contact means borne by said board-faceplate assembly and disposed at the back of said plate at laterally opposite ends thereof and having respective backward-facing electric contact surfaces which are resiliently deflectable in the longitudinal direction and are adapted to engage with respective contact surfaces of electroconductive regions on housing means for said card, and electrical conductor means adapted to conduct high frequency electric current, said electrical conductor means being carried by said board-faceplate assembly and being disposed back of said portion of said faceplate's back side which is non-registering with said end face of said board, said electrical conductor means extending between said two contact means in a path extending over such non-registering portion of said faceplate, and said electrical conductor means being electromechanically coupled with both said contact means to provide a low-resistance shunt between them.

2. A circuit card as in claim 1 in which electronic circuitry is distributed over said board thereby leaving at its margins a pair of border strips which are both bare of said circuitry, and in which said two electrical contact means comprise respective resilient metallic blade spring contacts having respective anchored ends fixedly fastened to the back side of said faceplate laterally inwards of the inner boundaries of said border strips, said contacts extending laterally from said anchored ends thereof, in the direction away from said ends over the whole lengths of said contacts, to free ends thereof, said free ends being resiliently deflectable in the longitudinal direction and being disposed laterally outward of said inner boundaries and, longitudinally back of and spaced from said faceplate when said contacts are in longitudinally undeflected condition.

3. A circuit card as in claim 2 in which said faceplate at its laterally opposite ends extends laterally outward of said inner boundaries of said border strips to provide backup by such plate for said free ends of said blade spring contacts, and in which said card further comprises latching means adapted by cooperation with said housing means to lock said card in said housing means and to concurrently squeeze such free ends of such contacts between said housing means and faceplate and, by such squeezing, to produce flat contact of each of such free ends both with said housing means and said faceplate.

4. A circuit card according to claim 1 in which said board has thereon discrete components mounted on said board to project forward from said front edge face thereof, said non-registering portion of said plate has formed therein apertures for reception therein of said discrete components, and in which said path of said electrical conductor means over said non-registering plate portion has an irregular configuration shaped to avoid blockage by said conductor means of insertion of said components into said apertures.

5. A circuit card according to claim 1 in which said two electrical contact means and said electrical conductor means constitute separate portions of an electroconductive metal strip fixedly fastened to the back side of said plate at two laterally spaced locations on said strip laterally inwards of the ends thereof, the portion of said strip between said locations constituting said conductor means, and the two portions of such strip laterally outwards of said locations constituting said two contact means.

6. A circuit card according to claim 5 in which said strip has holes therethrough at said two locations and is fastened to said plate by plastic studs integral with said plate and passing through said holes and having expanded heads formed therein on the side of said clip away from said plate.

7. A circuit card adapted to reduce electromagnetic interference ("EMI") comprising:
an insulative board having a longitudinally spaced front and rear and a laterally extending front edge face, electronic circuitry distributed over said board, a plastic insulative faceplate having front and back sides and fastened to constituting a board-faceplate assembly, said faceplate being disposed transverse to said board and forward of and adjacent to said face so as to lie over such face, a pair of electric contact means borne by said board-faceplate assembly and disposed at laterally opposite ends of said faceplate at the rear of said plate and having respective backward-facing electric contact surfaces which are resiliently deflectable in the longitudinal direction and are adapted in the use of said card to engage with respective electroconductive regions of grounded means adjacent to said card, and electrical conductor means adapted to conduct high frequency electric current, said electrical conductor means being carried by said board-faceplate assembly card and being electromechanically coupled with both such contact means to provide a low-resistance shunt therebetween.

8. Circuit card apparatus adapted to reduce electromagnetic interference ("EMI") comprising:
housing means enclosing a circuit card storage bay bounded at its rear by a backplane and at its top and bottom by upper and lower shelves and open at the front to access from the exterior of such means by way of a front opening provided by such means and extending vertically between said shelves and horizontally between side margins for such opening spaced from each by greater than the spacing between such shelves, electroconductive means providing a grounded closed-loop, electromagnetic wave energy path peripherally surrounding said opening, said means including electroconductive regions providing parts of said path which are disposed laterally opposite each other on the front of such upper and lower shelves, respectively, to border said opening, and which have outwardly facing metallized contact surfaces, an array of vertically oriented plug-in circuit cards inserted into said space from the front thereof to be removably held in said space in horizontally spaced side-to-side relation, each of said circuit cards comprising a vertical insulative board extending longitudinally inwards from the front of said space towards the rear thereof, electronic circuitry distributed over said board, and a vertical insulative faceplate having front and back sides and fastened to said board at its front such that the back side of such plate is longitudinally outwards of said contact surfaces, said board and said faceplate fastened thereto together forming a board-faceplate assembly, and at least one of said circuit cards further comprising electroconductive shunt means borne by said board-faceplate assembly at the front thereof to be disposed rearward of the back side of the faceplate of such card, said shunt means having vertically spaced contact surfaces in engagement with said contact surfaces of said regions, and said shunt means providing by virtue of such engagement a low-resistance shunt between said regions.

\* \* \* \* \*

UNITED STATES PATENT AND TRADEMARK OFFICE
CERTIFICATE OF CORRECTION

PATENT NO. : 4,991,062

DATED : February 5, 1991

INVENTOR(S) : Kinhquoc Nguyenngoc

It is certified that error appears in the above-identified patent and that said Letters Patent is hereby corrected as shown below:

In the claims, column 14, line 45, "fastened to constituting" should read --fastened to said board, said board and said faceplate fastened thereto together constituting--; line 60, delete "card".

Signed and Sealed this

Twenty-eighth Day of July, 1992

Attest:

DOUGLAS B. COMER

*Attesting Officer*     *Acting Commissioner of Patents and Trademarks*